United States Patent

Centanni et al.

[11] Patent Number: 6,146,480
[45] Date of Patent: *Nov. 14, 2000

[54] FLEXIBLE LAMINATE FOR FLEXIBLE CIRCUIT

[75] Inventors: Michael A. Centanni, Parma; Mark Kusner, Gates Mills, both of Ohio

[73] Assignee: GA-TEK Inc., Eastlake, Ohio

[ * ] Notice: This patent issued on a continued prosecution application filed under 37 CFR 1.53(d), and is subject to the twenty year patent term provisions of 35 U.S.C. 154(a)(2).

[21] Appl. No.: 09/266,952

[22] Filed: Mar. 12, 1999

[51] Int. Cl.$^7$ ...................................................... B32B 31/24
[52] U.S. Cl. ................... 156/151; 156/272.6; 156/273.9; 156/275.5; 156/275.7; 29/830; 428/41.8; 428/473.5; 428/901
[58] Field of Search .................................. 156/151, 272.2, 156/272.6, 273.9, 275.5, 275.7, 307.7; 219/633; 29/830; 427/536, 537, 96, 98, 99, 306; 174/254; 361/749, 750, 751; 428/666, 674, 40.1, 41.7, 41.8, 473.5, 901

[56] References Cited

U.S. PATENT DOCUMENTS

| | | | |
|---|---|---|---|
| 3,985,604 | 10/1976 | Balla | 156/272.2 |
| 4,337,279 | 6/1982 | Polak | 427/40 |
| 4,863,808 | 9/1989 | Sallo | 428/601 |
| 5,130,192 | 7/1992 | Takabayashi et al. et al. | 428/332 |
| 5,242,562 | 9/1993 | Beyerle et al. | 204/206 |
| 5,473,118 | 12/1995 | Fukutake et al. | 174/258 |
| 5,589,280 | 12/1996 | Gibbons et al. | 428/626 |
| 5,681,443 | 10/1997 | Ameen et al. | 205/125 |

OTHER PUBLICATIONS

U.S. application No. 09/266,951, Tad Bergstresser et al. filed Mar. 12, 1999, entitled: Laminate for Multi–Layer Printed Circuit.

*Primary Examiner*—Michael W. Ball
*Assistant Examiner*—Michael A Tolin
*Attorney, Agent, or Firm*—Mark Kusner; Michael A. Centanni

[57] ABSTRACT

Method of forming a flexible circuit laminate for use in the production of flexible circuits, comprising the steps of electrodepositing a continuous layer of copper on a first side of a generally continuous strip of polyimide having a layer of metal on the first side, modifying a second side of the polyimide strip to increase the surface energy thereof, applying a preformed adhesive film on the second side of the generally continuous strip of polyimide, the adhesive strip being formed of a substantially uncured polymeric material, and curing the adhesive film wherein at least the outmost layer of the adhesive film is only partially cured.

10 Claims, 2 Drawing Sheets

FLEXIBLE LAMINATE FOR FLEXIBLE CIRCUIT

FIELD OF THE INVENTION

The present invention relates to flexible circuits, and more particularly, to a flexible laminate for use in forming a flexible circuit.

BACKGROUND OF THE INVENTION

Flexible circuits find advantageous application where an electrical connector/conductor is subject to vibration or movement. Flexible circuits are generally comprised of a polymeric substrate having a copper circuit formed thereon. The electric circuit is generally formed from a continuous layer of copper electrodeposited onto one side of the polymeric substrate. In some instances, it may be desirable to be able to adhere the flexible circuit onto a support surface, or to attach two flexible circuits together with an intermediate insulating layer between the two circuits.

The present invention provides a flexible circuit component for use in forming flexible circuits and a flexible circuit that may be attached to another surface.

SUMMARY OF THE INVENTION

In accordance with the present invention, there is provided a method of forming a flexible circuit laminate for use in the production of flexible circuits, comprising the steps of: a) depositing a continuous layer of copper on a first side of a generally continuous strip of polyimide having at least one layer of metal on one side thereof; b) modifying a second side of the polyimide strip to increase the surface energy thereof; c) applying an adhesive onto the second side of the generally continuous strip of polyimide, the adhesive being formed of a substantially uncured, polymeric material, the polymeric material having properties in its uncured state wherein it will not flow under pressure exerted along its planar surface; and d) curing the adhesive wherein at least an outermost layer of the adhesive is only partially cured.

In accordance with another aspect of the present invention, there is provided a method of forming a flexible circuit laminate for use in the production of flexible circuits, comprising the steps of: a) depositing a continuous layer of copper on a first side of a generally continuous strip of polyimide film having a layer of metal on the first side; b) exposing a second side of the polyimide film to a chemical plasma at sufficient levels to modify the surface energy of the polyimide film; c) applying at least one layer of metal to the second side of the polyimide film; d) applying an adhesive onto the at least one layer of metal on the second side of the polyimide film, the adhesive being formed of a substantially uncured, polymeric material, the polymeric material having properties in its uncured state wherein it will not flow under pressure exerted along its planar surface; and e) inductively heating the polyimide film to cure the adhesive, wherein at least an outermost region of the adhesive is only partially cured.

In accordance with a further aspect of the present invention, there is provided a method of forming a flexible circuit laminate for use in the production of flexible circuits, comprising the steps of: modifying a first side and a second side of a generally continuous polyimide strip to increase the surface energy thereof; depositing a continuous layer of copper on the first side of the generally continuous strip of polyimide film, the first side having at least one layer of metal thereon; applying an adhesive onto the second side of the generally continuous strip of polyimide, the adhesive being formed of a substantially uncured, polymeric material, the polymeric material having properties in its uncured state wherein it will not flow under pressure exerted along its planar surface; and curing the adhesive wherein at least an outermost region of the adhesive is only partially cured.

It is an object of the present invention to provide a flexible laminate for use in forming flexible circuits.

Another object of the present invention is to provide a flexible laminate as described above wherein one side of the flexible laminate includes an at least partially uncured adhesive film.

Another object of the present invention is to provide a flexible laminate as described above wherein the laminate is comprised of a polymeric layer having a layer of copper adhered to one side of the polymeric substrate, and a layer of a polymeric adhesive applied to a second side of the polymeric substrate.

A still further object of the present invention is to provide a flexible laminate as described above wherein the polymeric adhesive is a dimensionally stable film of n uncured polymeric adhesive.

A still further object of the present invention is to provide a method of adhering a polymeric adhesive film to a polymeric substrate.

An even further object of the present invention is to provide a method as described above wherein the method includes the step of surface-treating the polymeric substrate to increase the surface energy thereof.

These and other objects and advantages will become apparent from the following description of preferred embodiments of the invention, taken together with the accompanying drawings.

BRIEF DESCRIPTION OF THE DRAWINGS

The invention may take physical form in certain parts and arrangement of parts, embodiments of which are described in detail in the specification and illustrated in the accompanying drawings, wherein.

DETAILED DESCRIPTION OF PREFERRED EMBODIMENTS

Figure 1:
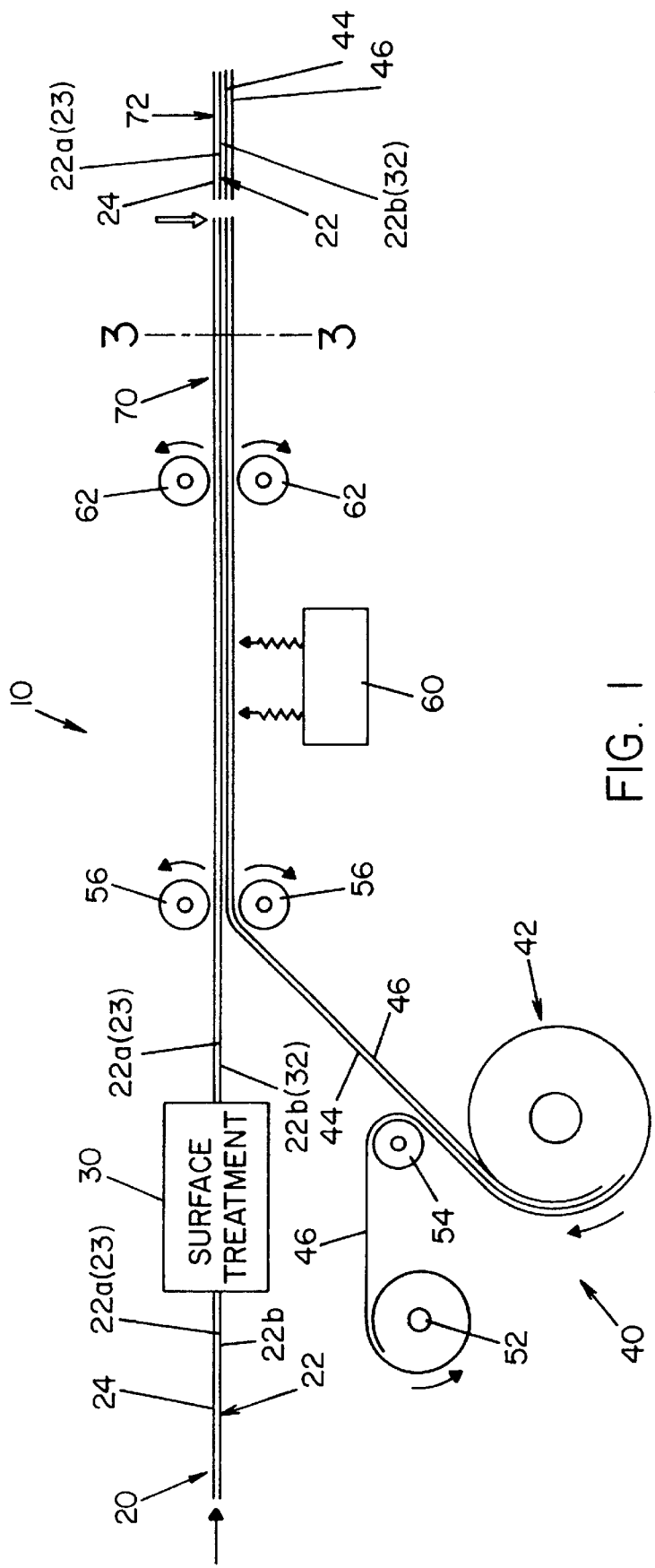
FIG. 1 is an elevational, schematic view of a process line for forming a flexible circuit laminate illustrating a preferred embodiment of the present invention.
Figure 2:
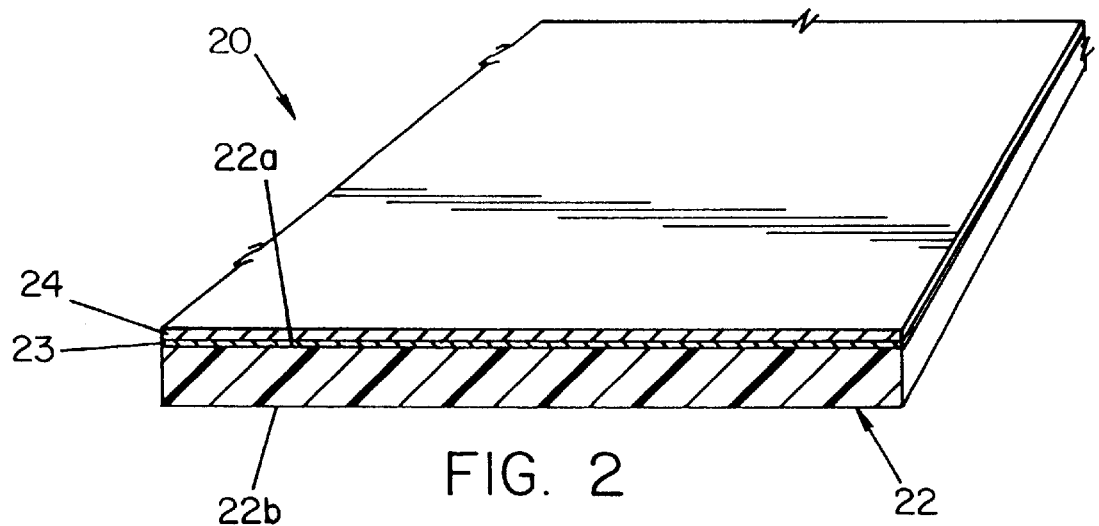
FIG. 2 is an enlarged, perspective view of a copper-coated polymeric strip prior to undergoing the process shown in FIG. 1.

Referring now to the drawings wherein the showings are for the purpose of illustrating preferred embodiments of the invention, and not for the purpose of limiting same, FIG. 1 shows a schematic view of a process line 10 for forming a flexible circuit laminate in accordance with the present invention. In the embodiment shown, a generally continuous strip or web 20 of a polymeric substrate having a layer of copper formed thereon is conveyed along a predetermined path. FIG. 2 shows an enlarged, perspective view of a portion of web 20. In FIG. 2, the polymeric substrate is designated 22 and the continuous layer of copper is designated 24. Substrate 22 has a first surface, designated 22a, and a second surface, designated 22b. The copper-coated, polymeric strip is preferably formed by applying a layer of metal 23 onto surface 22a of polymeric substrate 22. Layer 23 may be applied by a metal sputtering technique, or by a chemical vapor deposition process. Copper layer 24 is then electrodeposited onto metal layer 23.

In accordance with the present invention, the generally continuous web 20 of the copper-coated polymeric material is conveyed along a path wherein an adhesive 44 of a generally uncured resin material is applied thereto. Web 20 is preferably formed of a polyimide material, and more specifically, a biaxially oriented polyimide such as DuPont's kapton (KAPTON is a trademark of DuPont).

According to the present invention, adhesive 44 is an uncured, or substantially uncured, resin material that is generally dimensionally stable under the exertion of forces along its surface. As used herein, the term "dimensionally stable" as applied to the uncured resin material shall mean the resin has properties wherein it will not significantly alter its shape or flow under a pressure exerted along its planar surface as a result of stacking pressure. Basically, it is intended that the term "dimensionally stable," as used to describe the resin film used in the present invention, should distinguish such film from uncured resins that flow when under the exertion of planar pressure.

A product manufactured and sold by Minnesota Mining and Manufacturing (3M) under the name "High Performance Epoxy Adhesive Bonding Film" finds advantageous use as adhesive 44 in the production of flexible laminate 20 according to the present invention. This product is comprised of an epoxy resin and is available in thicknesses of about 1 or 2 mils under 3M designations "9901" and "9902," respectively. The materials are provided by the manufacturer with removable protective polymer films on both surfaces thereof. The material has the following physical properties as disclosed by the manufacturer.

| Property | Units | | IPC Test |
|---|---|---|---|
| Glass Transition* | ° C. | 180 | |
| CTE 20°–110° C. | ppm/° C. | 60 | |
| 110°–180° C. | | 87 | |
| 180°–250° C. | | 213 | |
| Peel Strength | Lbs./inch | 8 | 2.4.9 |
| Volatile Content | % | 1 | 2.3.37 |
| Moisture Absorption | % | 1.7 | 2.6.2B |
| Chemical Resistance | % | >90 | 2.3.2 |
| Dielectric Constant* | | 3.4 | 2.5.5.3 |
| Dissipation Factor* | | .022 | 2.5.5.3 |
| Dielectric Strength | Volts/mil | 2200 | D-149 |
| Insulation Resistance | Megohms | 1.00E + 06 | 2.6.3.2 |
| Volume Resistivity | Megohms-cm | 5.00E + 07 | 2.5.17 |
| Surface Resistivity | Megohms | 7.00E + 05 | 2.5.17 |
| Solder Float | | Pass | 2.4.13 |
| Low Temperature Flexibility | | Pass | 2.6.18 |
| Flexural Endurance | Cycles | 1787 | 3.7.4 |
| Fracture Toughness | Mpa*m½ | 0.65 | |
| Modulus | GPa | 3.5 | |

In accordance with the present invention, the exposed surface of polymeric strip 22 undergoes a surface treatment, schematically represented by a box 30 in FIG. 1, to modify the surface energy of the polymeric strip to insure appropriate adhesion. In this respect, the sine-qua-non of adhesion is wetting. Absence wetting, good adhesion between two materials will not occur. Specifically, if the surface energy of a surface is higher than the surface energy of an adhesive applied thereto, the applied adhesive will spread and wet the surface, thereby lowering the total energy of the surface. Good wetting is therefore required for good adhesion.

In accordance with the present invention, the exposed surface 22b of polymeric substrate 22 is treated to increase the surface energy thereof Treatment of surface 22b may be accomplished by heating or by ion bombardment, plasma treatment, electron etching, heat or other types of particle bombardment or electromagnetic wave radiation etching. Surface 22b of polymeric substrate 22 may also be exposed to a plasma of a chemical that adheres to substrate 22 and raises the surface energy thereof, for example, exposing substrate 22 to an oxygen plasma, a low molecular weight silane plasma, a plasma of a halogen gas such as a chlorine plasma, a bomine plasma, etc.

In accordance with a preferred embodiment of the present invention, surface 22b of substrate 22 undergoes a two-step surface treatment process to increase the surface adhesion properties thereof The adhesion properties of surface 22b may be increased through physically altering surface 22b to increase the surface are thereof, by chemically altering surface 22b to increase the surface energy thereof, or a combination of both. In a preferred embodiment, surface 22b undergoes a first step of surface treatment to physical or chemical modify surface 22b, followed by a second step wherein a layer of metal is deposited on the modified surface 22b.

The first step preferably physical roughens or chemical modifies surface 22b of substrate 22. Laser etching or electromagnetic radiation may be used to physical roughen surface 22b. Ion beam bombardment or plasma may be used to chemically alter surface 22b. In a preferred embodiment oxygen (O$_2$) plasma is applied to surface 22b prior to applying a metal layer in step two.

Referring now to step two, at least one thin layer of metal 32 is preferably applied to the previously treated surface 22b. Metal layer 32 that is applied to surface 22b may be selected from the group consisting of chromium, titanium, aluminum, nickel, copper, iron vanadium, silicon or alloys thereof. Metal layer 32 is preferably applied by a conventional metal sputtering technique. In a preferred embodiment, chromium (Cr) is sputtered onto surface 22b following surface preparation of surface 22b by oxygen (O$_2$) plasma as discussed in step one.

Chromium layer 32 preferably has a thickness of between about 50 Angstroms (Å) to about 300 Angstroms (Å). Chromium layer 32 provides a metal surface having a surface energy higher than the surface energy of polyimide substrate 22, thereby improving the adhesion between substrate 22 and adhesive 44 to be applied thereto. In this respect, chromium layer 32 further enhances the adhesion properties of the 10 roughened surface 22b. It will of course be appreciated that in some applications the further adhesion enhancement of metal 32 may not be required, and that the adhesion enhancement provided by the surface treatment of step one may alone be sufficient to provide satisfactory adhesion between surface 22 and adhesive 44.

Following surface treatment process 30, the generally continuous web 20 moves past an adhesive feed assembly 40. Adhesive feed assembly 40 is comprised of a roll 42 having an adhesive 44 in film form wound thereon. Adhesive film 44 is preferably of the type manufactured by 3M as described above. Removable, protective layers 46 are typically provided on both surfaces of adhesive film 44. In the process shown, the protective layer 46 on the surface of adhesive film 44 that is facing substrate 22 is removed by a film take-up roller 52. Specifically, protective layer 46 is directed over a nip roller 54 onto take-up roller 52. The removal of inner protective layer 46 exposes adhesive film 44 to chromium layer 32 on surface 22b of substrate 22. Heated nip rollers 56 force adhesive film 44 and layer 32 on surface 22b into engagement with each other as exposed adhesive film 44 engages treated layer 32 on surface 22b. Preferably, nip rollers 56 are heated sufficiently to warm adhesive film 44 to insure positive contact with layer 32 on substrate 22.

In accordance with one aspect of the present invention, web 20, with adhesive film 44 thereon, is preferably conveyed, in a continuous fashion, past a heating element, designated 60 in the drawings. Heating element 60 is operable to heat the uncured resin forming adhesive film 44. The heating of adhesive film 44 may be undertaken by conventional gas-fired electric-fired heating means or induction heating.

With respect to the preferred embodiment heretofore described, wherein chromium layer 32 is deposited onto surface 22b, web 20 is preferably heated by induction heating, wherein the induction heating of metallic layer 32 beats adhesive film 44 through radiation and conduction as the heat generated in metal layer 32 adjacent adhesive film 44 radiates and is conducted into adhesive film 44. Heating element 60 is preferably controlled such that adhesive film 44 is cured to what is conventionally referred to in the art as "B-staged." In this respect, it is conventionally understood that an "A-staged" resin refers to a resin that is substantially uncured. A "B-staged" resin refers to a resin that is partially cured, although not fully cured. A "C-staged" resin refers to a resin that is substantially fully cured.

Thus, in accordance with the present invention, adhesive film 44 on web 20 is only partially cured to a B-stage. Web 20 with adhesive film 44 thereon then preferably passes between two nip rollers 62. A continuous laminate, designated 70, is thus formed in accordance with the aforementioned process. Laminate 70 may then be cut into sheets 72, as schematically illustrated in FIG. 1.

Figure 3:
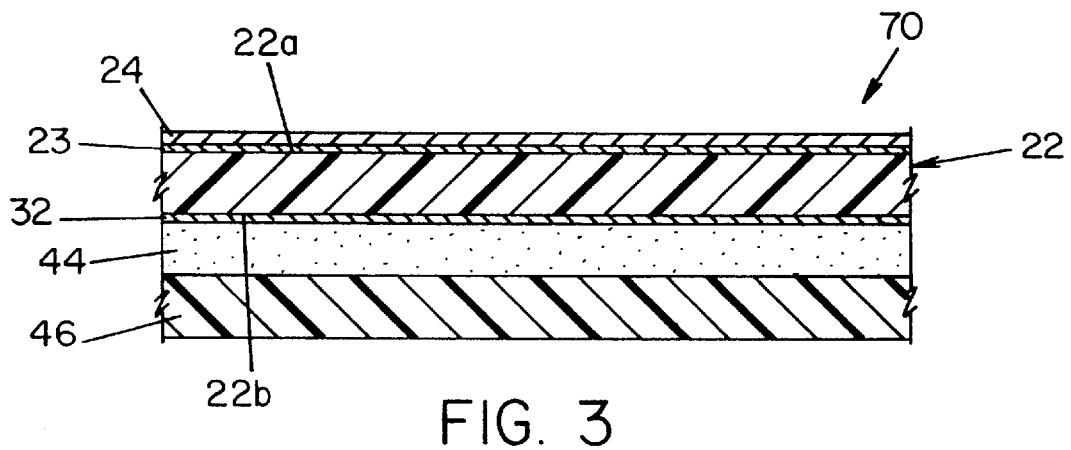
FIG. 3 is a cross-sectional view taken along the line 3—3 of FIG. 1, showing a flexible circuit laminate formed in accordance with the present invention.

FIG. 3 shows a cross-sectional view of a flexible laminate 70 formed in accordance with the process shown in FIG. 1, wherein a partially cured adhesive layer 44 having a protective, removable strip 46 is attached to polymeric substrate 22 that has a copper layer 24 on surface 22a thereof The foregoing description is a specific embodiment of the present invention. It should be appreciated that this embodiment is described for purposes of illustration only, and that numerous alterations and modifications may be practiced by those skilled in the art without departing from the spirit and scope of the invention. According to another aspect of the present invention, the induction heating of web 20 may be controlled such that the temperature of the region of adhesive film 44 in contact with the layer reaches a temperature whereby this region of adhesive is fully cured to a C-stage, but the outer region of adhesive film 44, and specifically, at outer surfaces of adhesive film does not attain a temperature for a sufficient length of time to fully cure such region, and therefore, the outer surface of adhesive film remains at least partially uncured, i.e., at an A-stage, a B-stage or a mixture of both. It is intended that all such modifications and alterations be included insofar as they come within the scope of the invention as claimed or the equivalents thereof.

What is claimed is:

1. A method of forming a flexible circuit laminate for use in the production of flexible circuits, comprising the steps of:

depositing a continuous layer of copper on a first side of a generally continuous strip of polyimide film having at least one layer of metal on said first side;

modifying a second side of said polyimide strip to increase the surface energy thereof;

applying an adhesive onto said second side of said generally continuous strip of polyimide, said adhesive being formed of a substantially uncured, polymeric material, said polymeric material having properties in its uncured state wherein it will not flow under pressure exerted along its planar surface; and curing said adhesive wherein at least an outermost region of said adhesive strip is only partially cured.

2. A method of forming a flexible circuit laminate for use in the production of flexible circuits, comprising the steps of:

modifying a first side and a second side of a generally continuous polyimide strip to increase the surface energy thereof;

depositing at least one layer of metal on said first side of said generally continuous strip of polyimide film;

depositing a continuous layer of copper on said at least one layer of metal on said first side of said generally continuous strip of polyimide film;

applying an adhesive onto said second side of said generally continuous strip of polyimide, said adhesive being formed of a substantially uncured, polymeric material, said polymeric material having properties in its uncured state wherein it will not flow under pressure exerted along its planar surface; and curing said adhesive wherein at least an outermost region of said adhesive strip is only partially cured.

3. A method of forming a flexible circuit laminate for use in the production of flexible circuits, comprising the steps of:

a) depositing a continuous layer of copper on a first side of a generally continuous strip of polyimide film having a layer of metal on said first side;

b) exposing a second side of said polyimide film to a chemical plasma at sufficient levels to modify the surface energy of said polyimide film;

c) applying at least one layer of metal to said second side of said polyimide film;

d) applying an adhesive onto said at least one layer of metal on said second side of said polyimide film, said adhesive being formed of a substantially uncured, polymeric material, said polymeric material having properties in its uncured state wherein it will not flow under pressure exerted along its planar surface; and e) inductively heating said polyimide film to cure said adhesive, wherein at least an outermost region of said adhesive is only partially cured.

4. A method as defined in claim 3, wherein said chemical plasma in step b) is oxygen.

5. A method as defined in claim 3, wherein said at least one layer of metal applied in step c) is formed from a metal selected from the group consisting of chromium, titanium, aluminum, nickel, copper, iron, vanadium, silicon and alloys thereof.

6. A method as defined in claim 5, wherein said at least one layer of metal applied in step c) has a thickness of about 50 to about 300 angstroms.

7. A method as defined in claim 6, wherein said at least one layer of metal applied in step c) is chromium.

8. A method as defined in claim 1, wherein said step of inductively heating is controlled such that the region of said adhesive in contact with said at least one layer of metal is fully cured and the outermost region of said adhesive is partially uncured.

9. A method as defined in claim 3, wherein a first surface of said adhesive is fully cured, and said first surface of said adhesive is in contact with said second side of said polyimide film.

10. A method as defined in claim 5, wherein a first surface of said adhesive is cured to a C-stage and a second surface of said adhesive is cured to a B-stage, said first surface of said adhesive being in contact with said second side of said polyimide film.

* * * * *